United States Patent [19]

Tewksbury

[11] 3,723,898

[45] Mar. 27, 1973

[54] FREQUENCY SYNTHESIZER

[75] Inventor: John Merle Tewksbury, Baltimore, Md.

[73] Assignee: The Bendix Corporation

[22] Filed: Mar. 31, 1972

[21] Appl. No.: 240,070

[52] U.S. Cl. ..........................331/4, 328/14, 331/40, 331/178

[51] Int. Cl. ..............................................H03b 3/08

[58] Field of Search ...............331/4, 40, 178; 328/14

[56] References Cited

UNITED STATES PATENTS 3,375,461 3/1968 Ribour et al. ............................331/4

3,619,802 11/1971 Lohrmann ..............................331/4

3,681,706 8/1972 Harzer ...................................331/4

*Primary Examiner*—John Kominski

*Attorney*—W. G. Christoforo

[57] ABSTRACT

A swept frequency synthesizer having multiple sweep speeds where the sweep speed is dependent upon the distance between the instantaneous output frequency and the desired output frequency. A harmonic generator produces a plurality of reference frequencies. The spacing between reference frequencies is decreased as the instantaneous output frequency approaches the desired frequency.

12 Claims, 12 Drawing Figures

FREQUENCY SYNTHESIZER

BACKGROUND OF THE INVENTION

This invention relates to frequency synthesizers and more particularly to swept frequency synthesizers having a harmonic generator for producing a plurality of reference harmonic frequencies and the desired output frequency is captured by sweeping the synthesizer output frequency through the reference frequencies until the desired reference frequency is attained.

A swept frequency synthesizer generally includes a harmonic generator which produces what is known as a picket fence of harmonic reference frequencies where a picket fence in the art refers to the harmonics of a single frequency. The synthesizer output frequency is generally obtained from a voltage controlled oscillator which is part of a phase locked loop. A desired output frequency is acquired by sweeping the voltage controlled oscillator from some minimum value through the reference frequencies until the desired frequency is attained. To accomplish this the output from the voltage controlled oscillator is mixed with the reference frequencies so that a null is generated each time the voltage controlled oscillator output frequency coincides with one of the reference harmonic frequencies. The desired frequency is identified by counting the number of nulls detected as the voltage controlled oscillator is swept from some base frequency to which the voltage controlled oscillator is driven just before the sweep begins. Generally a counter is loaded with this number and the detection of the various nulls used to count down the counter to a base count which signifies that the desired output frequency is attained. It is well known that the detector used to recognize the nulls as the voltage controlled oscillator is swept has a certain response time which limits the speed at which the voltage controlled oscillator can be swept. It is further known that this limitation on the sweep speed is considered an undesirable feature of swept frequency synthesizers.

SUMMARY OF THE INVENTION

The present invention permits a desired frequency to be acquired faster than has heretofore been possible with swept frequency synthesizers. In the invention being described a counter is provided for each frequency decade. For example, if a frequency synthesizer has a range from 50 to 80 MHz separate counters will be provided for 10 MHz, 1 MHz, 1/10 MHz, etc. down to the finest grannularity desired. In addition, reference harmonic frequencies are selectively available in decade steps. For example, harmonic frequencies can be selected at 10 MHz spacing, 1 MHz, and 0.1 MHz, etc. Progressively finer reference harmonic frequencies are selected as the instantaneously swept frequency approaches the desired frequency. The nulls detected as the output frequency sweeps through the references is entered into the associated counter.

A variable sweep generator is also provided which controls the speed at which the synthesizer frequency is swept through the reference frequencies. The variable speed sweep generator is in turn controlled by the various counters which together with gates comprise a sequencer. In this manner the speed at which the frequency synthesizer is swept is varied as the desired output frequency is approached.

It is thus an object of this invention to provide a swept frequency synthesizer which has variable sweep speeds.

It is another object of this invention to provide a swept frequency synthesizer which will acquire a desired frequency relatively rapidly.

It is another object of this invention to provide a swept frequency synthesizer having simplified logic.

It is still a further object of this invention to provide a frequency synthesizer of the type described which uses digital logic in its acquisition circuits.

It is one more object of this invention to provide a swept frequency synthesizer having simplified means for entering the desired frequency into the synthesizer.

DESCRIPTION OF THE PREFERRED EMBODIMENT

The invention will be described as embodied in a swept frequency synthesizer having a range from 50 to 80 MHz with a channel spacing of 25 k.c. This is done to illustrate the invention rather than to limit it. It should be obvious from the following description that swept frequency synthesizers having other ranges and channel spacing can be built by one skilled in the art following the teachings of the invention.

In the various figures like reference numbers refer to like elements.

Figure 1A:
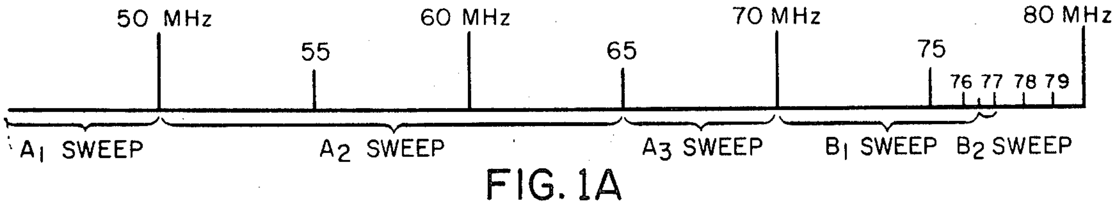
FIGS. 1A and 1B are line frequency graphs which are useful in explaining the broad principles of the invention.
Figure 1B:
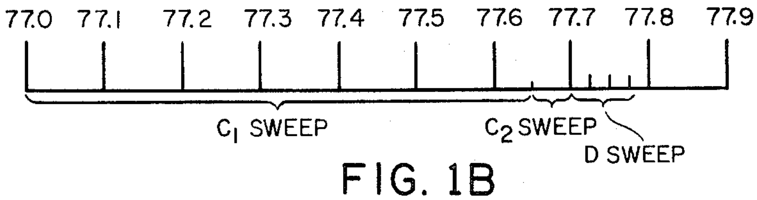

Refer first to FIG. 1A which shows a line graph of frequencies between 50 and 80 MHz, which is the frequency range of the embodiment to be described. FIG. 1B shows the frequencies from 77.0 to 77.9 MHz of FIG. 1A greatly expanded. It is assumed that the quiescent initial output frequency of the synthesizer is between 40 and 50 MHz. That is, the synthesizer output frequency at the beginning of the search sweep will be driven to a frequency between 40 and 50 MHz. It will also be shown below that at the beginning of the search sweep, during a period called the A-sweep, reference frequencies will be generated at 50, 60, 70 and 80 MHz. During a second portion of the search sweep the reference frequencies will be spaced 1 MHz apart. This will be designated the B portion of the sweep. During the third portion of the sweep, which is designated the C-sweep, reference frequencies are generated at 0.1 MHz spacing. During the final portion of the sweep, D-sweep, reference frequencies are generated at 25 KHz spacing. Also assume that a desired output frequency of 77.775 MHz is set into the frequency synthesizer to be described. The sweep will proceed as follows. When the search sweep is initiated the synthesizer output frequency will be driven to some value somewhat less than 50 MHz but greater than 40 MHz. The output frequency will then sweep upward during the A-1 portion of the sweep, which is a relatively low speed sweep, until the 50 MHz spectral line is detected. The sweep speed will then increase to the A-2 sweep and an intermediate detector will detect the midpoint between the reference frequencies, that is, 55 MHz and 65 MHz. At 65 MHz the sweep speed will change to the A-3 sweep which is a slower sweep speed. The output frequency will continue to increase until the 70 MHz reference frequency is detected. The sweep speed will increase to the B-1 sweep speed rate. During B-1 and B-2 sweeps, reference harmonic frequencies at 1 MHz channel spacing are generated and the reference harmonic frequencies at 10 MHz channel spacing are extinguished. A special intermediate detector detects the midpoint between the various reference frequencies as the synthesizer continues its sweep. At 76.5 MHz the sweep rate switches to the B-2 sweep speed which is a relatively lower speed. This low speed sweep continues until 77 MHz is detected. At that time, and referring now to FIG. 1B, the sweep rate again changes to the C-1 sweep speed. Also at this time the reference harmonic frequencies at 1 MHz channel spacing are extinguished and a new set of reference harmonic frequencies at 0.1 MHz channel spacing are produced. The C-1 sweep rate is a relatively fast rate and the synthesizer now sweeps from 77 MHz to 77.65 MHz detecting during this sweep by means of a special detector the intermediate point between the reference harmonic frequencies. At 77.65 MHz the sweep rate again decreases to a C-2 sweep rate until 77.7 MHz is detected. At this time the reference harmonic frequencies at 0.1 MHz are extinguished and reference frequencies at 25 KHz are produced. The sweep now proceeds at the D sweep rate until three of the reference harmonic frequencies are counted at which time the synthesizer is locked on a reference frequency at 77.775 m.c.

Figure 2:
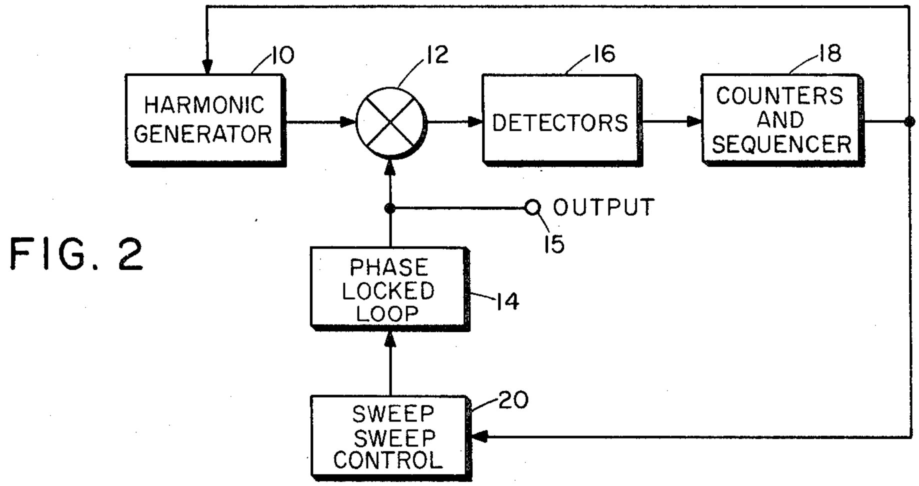
FIG. 2 is a simplified block diagram of the invention.

FIG. 2, reference to which should now be made, shows the means by which the above mentioned frequency search is accomplished. A harmonic generator 10 in response to signals received from counters and sequencer 18 generates the various reference harmonic frequencies required. These reference frequencies are combined in mixer 12 with the output frequencies from a phase locked loop 14. The phase locked loop output frequency comprises the synthesizer output and appears at terminal 15. The output of mixer 12 is connected to the input of various detectors 16 which detect when the phase locked loop output frequency crosses through the reference harmonic frequencies and the intermediate point between reference harmonic frequencies. The number of times a reference frequency and intermediate points are crossed are recorded in the counters and sequencer means 18. The state of the counters as determined by the sequencer determines which reference harmonics will be produced by harmonic generator 10 and in addition controls the search sweep rate of phase locked loop 14 through the means of sweep speed control 20.

Figure 3:
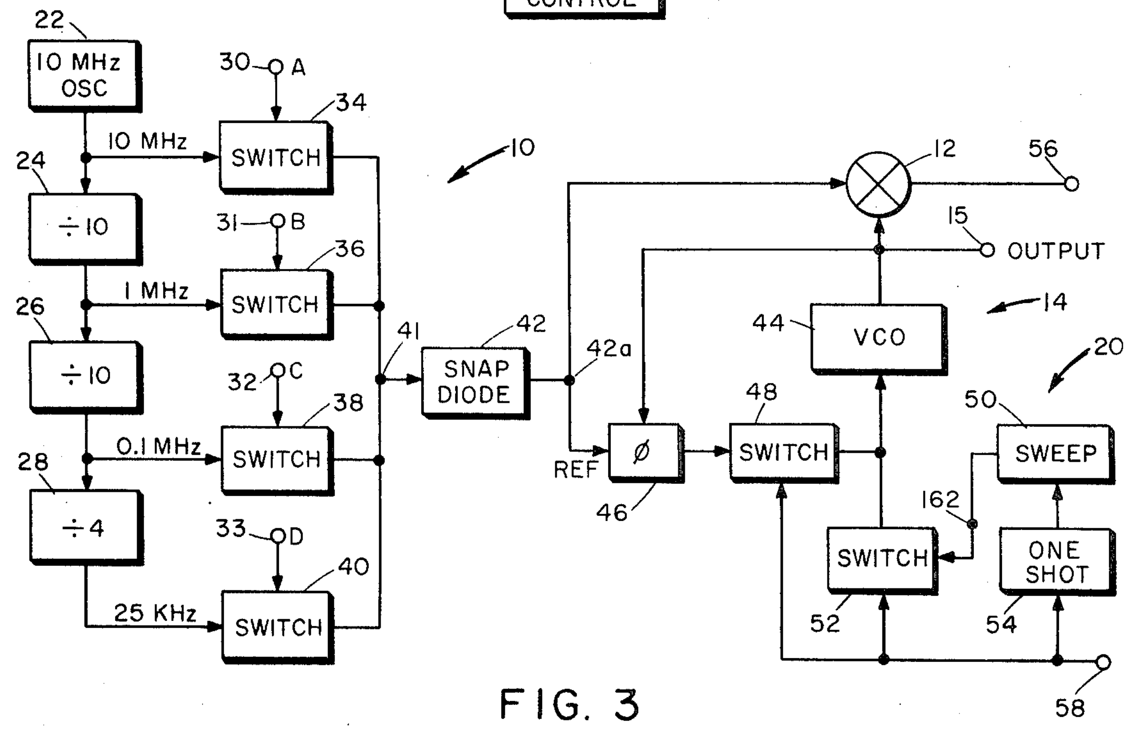
FIG. 3 is a block diagram of a spectrum generator and phase locked loop used in the invention.

Refer now to FIG. 3 which shows in greater detail the harmonic generator 10, phase locked loop 14 and sweep speed control 20. Also seen are the mixer 12 and synthesizer output terminal 15 of FIG. 2. The harmonic generator in this embodiment is comprised of a 10 MHz oscillator 22 which produces a reference frequency at 10 MHz, a divide by 10 counter 24 which produces a 1 MHz reference frequency, a divide by 10 counter 26 which produces a 0.1 MHz reference frequency and a divide by 4 counter 28 which produces a reference frequency at 25 KHz. It should be understood that the reference frequencies are designed by the system designer to meet his particular application. The various reference frequencies are selectively applied to an output bus 41 through switches 34, 36, 38 and 40, respectively. As will be explained below, only one switch at a time is closed, the closing being accomplished by a signal at one of the terminals 30, 31, 32 or 33, respectively, which are further designated as A, B, C or D terminals, respectively. The frequency switched to bus 41 is applied to a snap diode 42 whose output, as well known, comprises the harmonics of its input frequency. Thus, as an example, if switch 34 is closed due to a signal at terminal 30 the 10 MHz frequency signal appears at bus 41 and the harmonics of this frequency appear at the snap diode output terminal **42*a*. It should be understood that switches 34, 36, 38 and 40** are suitable electronic switches of the type known to those skilled in the art.

Phase locked loop 14 is basically comprised of voltage controlled oscillator 44 and phase detector 46. When the phase locked loop is operative, that is, when electronic switch 48 is closed and electronic switch 52 is open, which condition occurs when the synthesizer has locked to the proper reference at the termination of its search sweep, phase detector 46 compares the output signal from the voltage controlled oscillator with the reference signals at terminal **42*a*** to lock the phase locked loop and hence the synthesizer at the desired frequency.

During the search sweep, as described with respect to FIGS. 1A and 1B, switch 48 will be opened and switch 52 will be closed. In that condition, sweep speed control means 50 controls the output frequency from voltage controlled oscillator 44 which now sweeps upward as previously described.

During the search sweep, the mixed frequency products from mixer 12 as a result of heterodying the voltage controlled output frequency with the reference frequencies at terminal **42*a* appear at terminal 56**.

Figure 4:
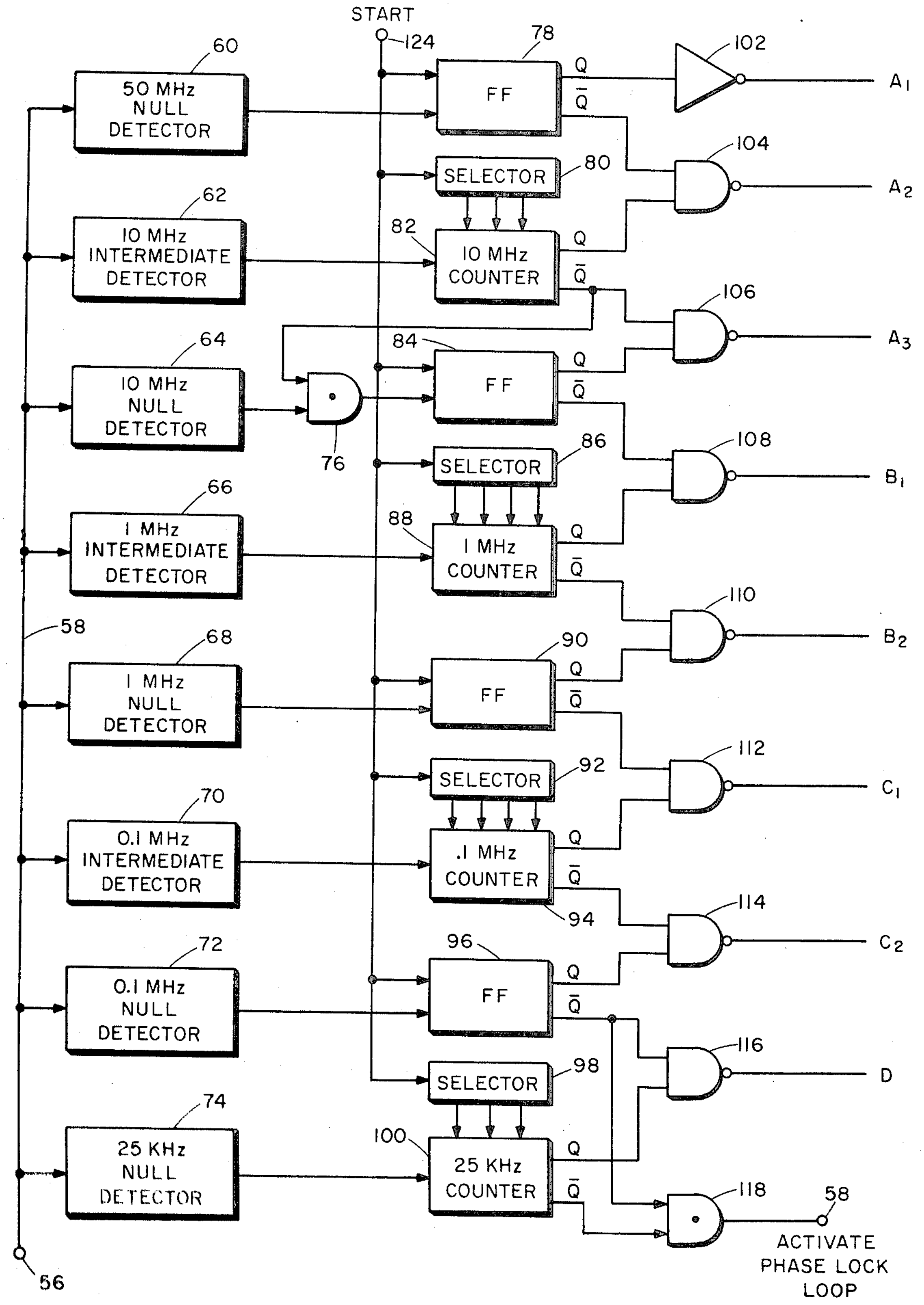
FIG. 4 is a block diagram illustrating a sequencer suitable for use in the invention.

Terminal 56 is also seen at FIG. 4, reference to which figure should now be made. Terminal 56 connects with bus 58 which connects to the input of the various detectors, namely, a 50 MHz null detector 60, a 10 MHz intermediate detector, a 10 MHz null detector 64, a 1 MHz intermediate detector 66, a 1 MHz null detector 68, a 0.1 MHz intermediate detector 70, a 0.1 MHz null detector 72 and a 25 KHz null detector 74. A null detector produces an output whenever the synthesizer output frequency passes through the respective frequency reference harmonic. An intermediate detector produces an output whenever the synthesizer output frequency passes through a point intermediate between adjacent ones of the applicable reference frequency harmonics.

Figures 4A, 5, 6, 7:
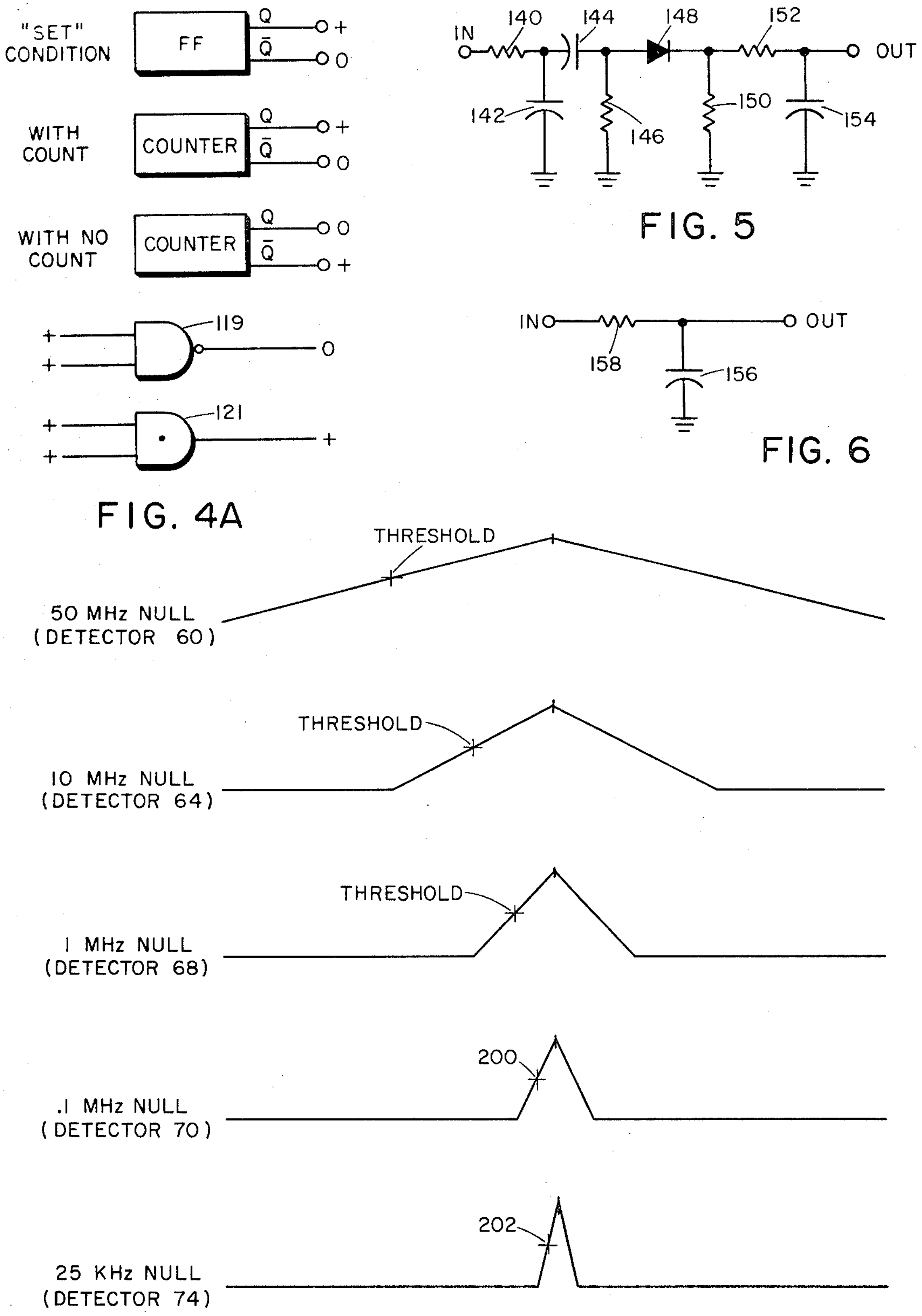
FIG. 4A is a block diagram of certain circuit elements and is helpful in explaining the conventions used in FIG. 4.
FIG. 5 is a schematic of an intermediate detector used with the invention.
FIG. 6 is a schematic of a null detector used in the invention.
FIG. 7 illustrates the response characteristic of the zero detectors used in this embodiment of the invention.

The schematic of a typical intermediate detector is seen at FIG. 5, reference to which should now be made. The intermediate detector is comprised of an input terminal which is connected to bus 58 of FIG. 4 and an output terminal whose connection will be explained below. Serially connected between the input terminal and the output terminal are resistor 140, capacitor 144, diode 148 and resistor 152. A capacitor 142 connects the junction of resistor 140 and capacitor 144 to ground. A capacitor 154 is connected between the output terminal and ground. In like manner, resistors 146 and 150, the first having one end connected to the anode of diode 148 and the second having one end connected to the cathode of diode 148 have their other ends connected to ground. Resistor 140 and capacitor 142 together comprise an integrating circuit. Capacitor 144 and resistor 146 comprise a differentiating circuit. Diode 148 is a detector diode, while the combination of resistors 150 and 152 together with the capacitor 154 comprise a second integrator. As well known to those skilled in the electrical arts, the first integrator and the differentiator will produce an output signal at the anode of diode 148 which rises as the input frequency increases from zero and will decrease as the input frequency returns towards zero. Of course, a null of zero frequency appears on bus 58 of FIG. 4, that is, at the detector input terminal when the synthesizer frequency passes through a reference frequency and the frequency at the bus increases to a maximum at a point intermediate adjacent reference frequencies and then the frequency at bus 58 moves again towards the null as the synthesizer frequency approaches the next reference frequency. Thus, at a point intermediate to adjacent reference frequencies, assuming that the sweep speed is slow enough to permit the circuit to respond, the voltage at the anode of diode 148 will rise to a point high enough to forward bias that diode to produce an input to the second integrator. If the second integrator input persists for a long enough time period as determined by the time constants of the second integrator circuit an output signal will be generated at the output terminal. The constants of the circuit can be chosen by one skilled in the art so the circuit will respond only to the intermediate point between two reference frequencies of interest.

A typical null detector of the type known to those skilled in the art is shown in FIG. 6, reference to which should now be made. This detector is an integrating circuit comprised of resistor 158 connected between an input and an output terminal and a capacitor 156 connected between the output terminal and ground. The response of the circuit of FIG. 6 peaks when the frequency signal at its input passes through a frequency null. As well known to those skilled in the electrical arts, the sharpness of this peak is determined by the value of the elements 156 and 158.

FIG. 7 shows simplified response curves for the various null detectors and reference should now also be made to this figure. As shown, the 50 MHz null detector has an extremely broad response curve while 10 MHz, 1 MHz, 0.1 MHz, 25 KHz null detectors have progressively sharper peaks. The reason for this will be made clear below. It is assumed that the threshold, that is, the point at which the voltage on the detector output terminal is sufficient to influence the element to which it is attached, occurs half-way up the front slope of the response curve.

Returning now to FIG. 4 it can be seen that the counter and sequencer portion additionally are comprised of flip flops 78, 84, 90 and 96 and counters 82, 88, 94 and 100. The convention used with respect to the flip flops and the counters is illustrated at FIG. 4A, reference to which should also be made. In the set condition, a flip flop produces a high signal at its Q output terminal and a ground signal at its $\overline{Q}$ output terminal. A counter having a count therein produces a high signal at its Q output terminal and a ground signal at its $\overline{Q}$ output terminal while a counter having no count therein produces a ground signal at its Q terminal and a high signal at its $\overline{Q}$ output terminal. When all the inputs to AND gate 119 are high its output is low while when all the inputs to AND gate 121 are high its output is high.

Again returning to FIG. 4 it can be seen that the output terminal of the 50 MHz null detector 60 is connected to the reset input terminal of flip flop 78. The $\overline{Q}$ output terminal of a 10 MHz counter 82 is connected through AND gate 76 together with the output from null detector 64 to the reset input terminal of flip flop 84. The output terminals of null detectors 68 and 72 are connected to the reset terminals respectively of flip flops 90 and 96. There are three intermediate detectors. A 10 MHz intermediate detector 62 responds to the midpoint between the 10 MHz reference harmonic frequencies and its output is applied as counting pulses to 10 MHz counter 82. A 1 MHz intermediate detector 66 responds to the intermediate points of the 1 MHz reference harmonic signals and its output is applied as counting pulses to 1 MHz counter 88. A 0.1 MHz intermediate detector 70 responds to the intermediate points of the 0.1 MHz reference harmonic frequencies and its output is applied as counting pulses to the 0.1 MHz counter 94. A 25 KHz null detector 74 has its output applied as counting pulses to 25 KHz counter 100.

Associated with each counter is an individual selector, namely, selectors 80, 86, 92 and 98 associated respectively with counters 82, 88, 94 and 100. A selector is suitably comprised of a single multiposition rotary switch which converts a selected decimal digit to a binary signal. Each selector selects that portion of the desired frequency output signal designated by its associated counter. For example, selector 80 in this embodiment will select an output signal of 50, 60, 70, or 80 KHz. Selector 86 will select the whole MHz portion of the signal, while selector 92 selects the 1/10th MHz portion and selector 98 selects the 25 KHz portion. Thus, in the example given earlier with the desired synthesizer output frequency of 77.775 MHz selector 80 will select a 7 as will selectors 86 and 92 while selector 98 will select 75. If a frequency of 53.050 were to be selected for example, selector 80 will select a 5, selector 86 will select a 3, selector 92 will select a 0 and selector 98 will select a 50. As will be shown below in this embodiment selector 80 converts the digit 5 to a binary 0, the digit 6 to a binary 1, the digit 7 to a binary 2 and the digit 8 to a binary 3. Selectors 86 and 92 convert the decimal digit directly into the corresponding binary number, for example, decimal 7 will be converted directly into binary 7. Selector 98 converts 0 to a binary 1, 25 to a binary 2, 50 to a binary 3 and 75 to a binary 4.

The Q output terminal of flip flop 78 is connected to inverter 102 whose output when low comprises an A-1 signal. The $\overline{Q}$ output of flip flop 78 together with the Q output of counter 82 are connected as inputs to AND gate 104 whose output signal when low is an A-2 signal. The $\overline{Q}$ output from counter 82 together with the Q output from flip flop 84 are connected to AND gate 106 whose output when low is an A-3 signal. The $\overline{Q}$ output from flip flop 84 together with the Q output from counter 88 are connected to AND gate 108 whose output when low is a B-1 signal. The $\overline{Q}$ output from counter 88 together with the Q output from flip flop 90 are connected to AND gate 110 whose output when low is the B-2 signal. The $\overline{Q}$ output from flip flop 90 together with the Q output from counter 94 are connected to AND gate 112 whose output when low is a C-1 signal. The $\overline{Q}$ output from counter 94 together with the Q output from flip flop 96 are connected to AND gate 114 whose output when low is a C-2 signal. The $\overline{Q}$ output from flip flop 96 together with the Q output from counter 100 are connected to AND gate 116 whose output when low is a D output. The $\overline{Q}$ output from flip flop 96 together with the $\overline{Q}$ output from counter 100 are connected to AND gate 118 whose output when high indicates that the search is complete and is used to lock the synthesizer to the acquired frequency spectral reference. The signals referenced at the right hand portion of FIG. 4 are used to set the sweep speed and to select the reference harmonic frequencies as will be shown below.

A start pulse at terminal 124 initiates the search as will also be explained below and sets the various flip flops while at the same time gating the number in each of the selectors into its associated counter.

Figures 8, 9:
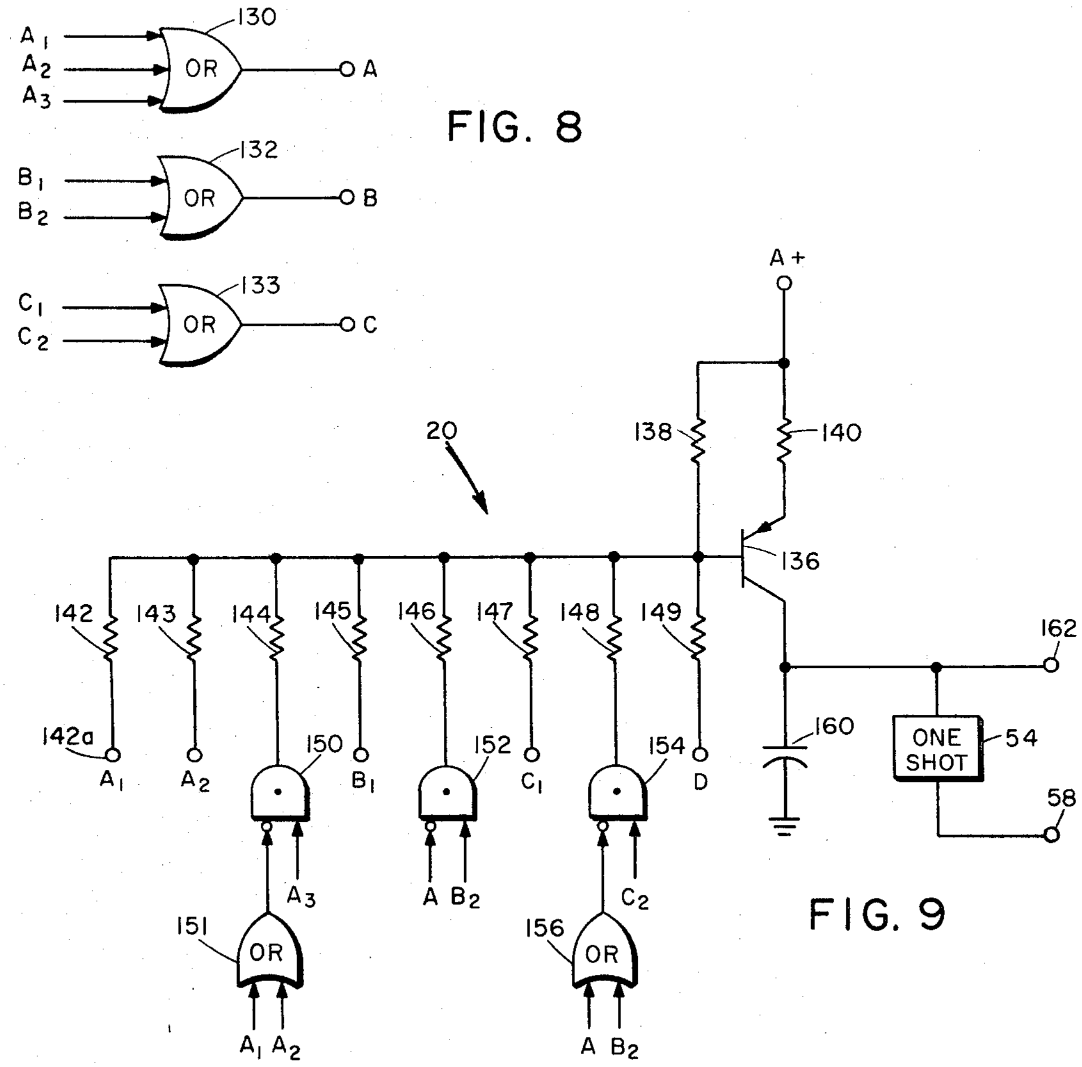
FIG. 8 is a block diagram illustrating means for combining the various speed control signals to produce reference control signals.
FIG. 9 is a schematic of the sweep speed control used with the invention.

Refer now to FIG. 8 where it can be seen that signals A-1, A-2 and A-3 are applied as inputs to OR gate 130 whose output is designated an A signal. In the same manner signals B-1 and B-2 are applied as inputs to OR gate 132 and signals C-1 and C-2 are applied as inputs to OR gate 133 whose outputs are respectively designated B and C signals. These A, B and C signals together with the D signal of FIG. 4 are used by the harmonic generator of FIG. 3 and more particularly by switches 34, 36, 38 and 40 thereof to apply the proper reference signal to bus 41 as previously discussed.

Refer now to FIG. 9 which is a schematic of a sweep speed control 20 previously encountered at FIG. 2. The speed control includes a constant current generator comprised of PNP transistor 136 having an emitter electrode connected through resistor 140 to a source of positive voltage potential A+. A bias resistor 138 connects between the A+ voltage source and the transistor base electrode. The transistor base electrode is further selectively connected to ground through one of the speed control resistors 142 to 149 as controlled by the output signals from the sequencer of FIG. 4. For example, if the sequencer is instantaneously generating the A-1 signal, terminal **142*a* will be grounded while resistors 143 from 149 will be ineffective so that the rate at which current is produced by the constant current generator will be determined by resistors 138 and 142. This current flows into capacitor 160 which is connected between the transistor collector electrode and ground. The output from the sweep generator is thus an upward ramping voltage which is available at terminal 162. A one-shot 54 which is also seen in FIG. 3 is triggered by a signal at terminal 58, which terminal is also seen in FIG. 3, and its output is applied at terminal 162** to drive that terminal voltage to some initial value when the sweep is initiated as will be explained below.

Inhibited AND gates 150, 152 and 154 together with OR gates 151 and 156 insure that only one of the speed control resistors 142 to 149 will be activated at any one time. Consideration of the AND gates of FIG. 4 together with the gates of FIG. 9 will make this clear.

OPERATION

The operation of the synthesizer will be explained first with respect to FIG. 4, reference to which figure should once again be made. Assume that the frequency of 77.775 MHz is desired. In that case, selectors will be manipulated so that selector 80 has available at its output the binary equivalent of two. Selectors 86 and 92 will have available at their outputs respectively the binary equivalent to seven while selector 98 will have available at its output the binary equivalent of 4. Assume now that a start pulse is applied to terminal 124 thus resetting the flip flops and gating the binary numbers into the associated counters from the selectors. Since flip flop 96 is now set, its $\overline{Q}$ output terminal is low and gate 118 closes. This removes the signal at terminal 58. Referring briefly to FIG. 3, when the signal at terminal 58 goes low switch 48 opens and switch 52 closes thus removing the phase locked loop from the operation of the synthesizer and applying the sweep output signal at terminal 162 through now closed switch 52 to the input of voltage controlled oscillator 44. At the same time one-shot 54, shown also in FIG. 9, is triggered thus driving the voltage at terminal 162 to its base value. This drives the output frequency of voltage controlled oscillator 44 to its initial value, which it will be remembered is the value between 40 and 50 MHz. At the completion of the one-shot output pulse the voltage at terminal 162 is released. With flip flop 78 of FIG. 4 now set, its Q output terminal signal is inverted by inverter 102 so that the A-1 signal is generated. This A-1 signal energizes the sweep generator into the A-1 sweep rate and in addition closes switch 34 of FIG. 3 through OR gate 30 of FIG. 8. The 10 MHz signal is thus transferred to bus 41 and the 10 MHz reference harmonics are applied to mixer 12. The voltage controlled oscillator will now commence to sweep upward and will intercept the first reference harmonic at 50 MHz. Detector 60 will then generate an output which is applied to the reset input terminal of flip flop 78 thus extinguishing the A-1 signal and generating an input to AND gate 104. Of course, detector 64 will also generate an output at 50 MHz. However, since gate 76 is closed at this time, the detector output signal will be ineffective.

Since counter 82 contains a count, that is, a count of two, its Q output terminal will be high and gate 104 will open and generate the A-2 signal. Sweep speed control 20 will now shift to the A-2 sweep speed which it will be remembered is a relatively rapid speed. Intermediate detector 62 will generate an output at 55 and 65 MHz at which time counter 82 will become zero thus closing gate 104 and opening gate 106. The A-2 signal is thus extinguished and the A-3 signal is generated which when applied to sweep speed control 20 produces the A-3 sweep rate which it will be remembered is a relatively slower sweep rate. In addition AND gate 76 becomes qualified so that when null detector 64 generates an output at 70 MHz the output signal will pass through gate 76 and reset flip flop 84. This closes gate 106 and opens gate 108 thus extinguishing the A-3 signal and generating the B-1 signal. Once again, the sweep speed control 20 changes speed to the B-1 speed which is a relatively rapid speed. In addition, switch 34 of FIG. 3 now opens and switch 36 closes to thus pass the 1 MHz reference to bus 41 so that the 1 MHz reference harmonics now appear at the input to mixer 12. Detector 60 now generates an output at points intermediate to reference harmonics. When seven detector outputs are counted, that is at a frequency of 76.5 MHz, counter 88 goes to zero thus closing gate 108 extinguishing the B-1 signal and opening gate 110 to produce the B-2 signal. The null detector 68 has been designed so that it will not respond to nulls produced during the relatively rapid B-1 sweep rate. However, at the B-2 sweep rate, which is relatively slower, it generates an output which will be at 77 MHz. This output resets flip flop 90 thus closing gate 110 to extinguish the B-2 signal and opening 112 to produce the C-1 signal. Again the sweep speed control changes speeds and in addition switch 36 of FIG. 3 opens and switch 38 closes so that the 0.1 MHz reference appears at bus 41 and the 0.1 MHz reference harmonics are applied to mixer 12. Detector 70 now produces seven output signals to count counter 94 to zero thus closing gate 112 and opening gate 114 to thus extinguish the C-1 signal and produce the C-2 signal. As was the case with detector 68, detector 72 will not generate an output at the C-1 speed rate, however, at the C-2 speed rate it produces an output at the next reference, which is at 77.7 MHz. This output resets flip flop 96 to thus open gate 114 extinguishing the C-2 signal and closing gate 116 to produce the D signal. The D signal closes switch 40 of FIG. 3 so that the 25 KHz reference harmonics are now applied to mixer 12 and the voltage controlled oscillator continues its search at the D sweep rate.

Referring now to FIG. 7 it can be seen that the threshold of the the 0.1 MHz null detector at 200 occurs at a slightly lower voltage controlled oscillator frequency than the threshold of 25 KHz null detector at 202 because of the response curves of the various detectors as previously discussed. At the D sweep rate the 25 KHz null detector 74 will detect all nulls on bus 58, the first null being immediately after the null generated by the 0.1 MHz null detector 72 at 77.7 MHz. This null detected by detector 74 will be the same null and thus will produce an output which is applied to counter 100. This is the reason the extra count is added into counter 100. Detector 74 will detect three more nulls to count counter 100 to zero. This will be at 77.775 MHz. At that time gate 118 will open and the activate signal will appear at terminal 58. As previously mentioned, this signal at terminal 58 will open switch 52 thus removing the sweep speed control from the circuit and will close switch 48 thus activating the phase locked loop. Accordingly, the voltage controlled oscillator 44 will lock onto the acquired spectral line at 77.775 MHz.

Assume now that an output frequency of 50 MHz is desired. Thus, at the time a start pulse is applied at terminal 124 the flip flops will be set and all counters will have entered therein a zero except for counter 100 which will have entered a one. With flip flop 78 set, the A-1 signal is generated and referring to FIG. 7, the A-1 signal will remain on until the threshold of detector 60 is reached. At this time the A-1 signal will be extinguished. The A-2 signal will not be generated since counter 82 is at zero, however, the A-3 signal will be generated and the sweep will continue until the threshold of detector 64 is reached. At that time flip flop 84 is reset extinguishing the A-3 signal. However, since counter 88 is at zero the B-1 signal will not be generated. However, the B-2 signal will be generated and the sweep will continue at the B-2 rate until the threshold of detector 68 is reached at which time flip flop 90 is reset extinguishing the B-2 signal. Since counter 94 is at zero the C-1 signal will not be generated. However, the C-2 signal will be generated and sweep continues at the C-2 rate until the threshold of detector 72 is reached. At that time, the C-2 signal is extinguished and the D signal is generated. Sweep will continue at the D rate until the threshold of detector 74 is reached at which time the synthesizer will lock up at 50 MHz. In this manner the lock up of the synthesizer is always done at the D sweep rate and very close to the proper spectral reference line.

Figure 10:
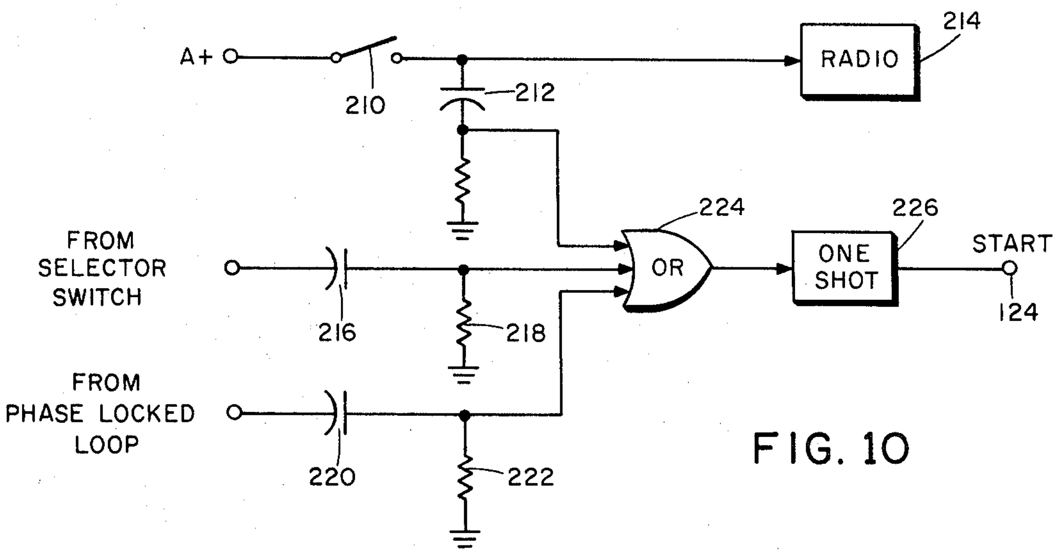
FIG. 10 is a modified schematic of a useful initiating circuit.

The start signal for terminal 124 can be generated in various ways. For example, the start signal can be generated from a separately actuated switch after the frequency has been selected by the manipulation of the selectors of FIG. 4. However, it is preferable that the start signal be generated automatically. An automatic initiating circuit for generating the start signals is seen in FIG. 10, reference to which should now be made. The start signal can be generated when the equipment using the particular frequency synthesizer is energized. For example, if the synthesizer is used in a radio such as radio 214, when the radio is connected to a power source, for example source A+ through the closing of switch 210, a resultant pulse passing through capacitor 212 and through OR gate 224 is used to trigger one-shot 226 which generates a start pulse at terminal 124. It is also desirable that any manipulation of a selector of FIG. 4 cause a start pulse to be generated. This can be accomplished by using a selector of the break-before-make type and sensing the resultant interruption of power. This interruption is detected by the differentiator comprised of capacitor 216 and resistor 218 and passes through OR gate 224 to trigger one-shot 226. It is also known that physical or electrical shock to a phase locked loop may cause it to jump one or more channels. In so jumping it is known that the voltage applied to the voltage controlled oscillator will pass through a maximum while the jump is taking place. This change in voltage can be detected by the differentiator comprised of capacitor 220 and resistor 222 is transmitted through OR gate 224 to trigger one-shot 226.

As aforementioned, the 1 MHz null detector 68 of FIG. 4 is designed so that it does not respond to nulls during the relatively fast B-1 sweep nor does the 0.1 MHz null detector 72 respond to nulls during the relatively fast C-1 sweep. At the option of the system designer an additional gate may be provided with either null detector 68 or null detector 72 or both to absolutely prohibit any adverse affects of improper null detection. These gates are suitably similar to gate 76 which was required for the 10 MHz null detector 64 because of the relatively slow $A_1$ rate at which 50 MHz is reached. Briefly, an AND gate can be provided to receive as inputs the $\overline{Q}$ output from counter 88 and the output signal from null detector 68, the output from the AND gate is then connected to flip flop 90 reset input terminal. In like manner, a further AND can be provided to receive as inputs the $\overline{Q}$ output from counter 94 and the output from null detector 72 while the gate output is connected to flip flop 96 reset input terminal.

Certain other alterations and modifications of the described embodiment will also suggest themselves to one skilled in this art. Accordingly, the invention is to be limited only by the true scope and spirit of the appended claims.

The invention claimed is:

1. In a frequency synthesizer a sweep search frequency acquisition means effective during an acquisition mode comprising:
- a sequencer including a counter means;
- a phase locked loop including a voltage controlled oscillator whose output frequency is dependent upon an applied voltage;
- a harmonic reference frequency generator for selectably generating one reference frequency harmonic group out of a plurality of such groups in response to the state of said sequencer;
- means for mixing the phase locked loop output frequency with the selected reference frequency harmonic group to thereby generate counter signals, said counter signals being accumulated by said counter means to vary the state of said sequencer; and,
- a sweep means for varying the voltage applied to said voltage controlled oscillator at least during the time said synthesizer is in said acquisition mode.

2. Acquisition means as recited in claim 1 wherein said sweep means comprises sweep speed control means responsive to the state of said sequencer for changing the rate at which said voltage is varied.

3. Acquisition means as recited in claim 2 wherein said sweep speed control means comprises:
- a capacitor, the voltage at which comprises said voltage;
- a constant current generator responsive to a selected electrical means for supplying charges to said capacitor at a rate determined by the selected electrical means; and,
- a plurality of said electrical means, one of said electrical means being selected in response to the state of said sequencer.

4. Acquisition means as recited in claim 3 with additionally means for generating a start signal, said sweep speed control means being responsive to said start signal for discharging the voltage at said capacitor to a predetermined base voltage.

5. Acquisition means as recited in claim 1 wherein said means for mixing includes first detector means for generating counter signals when said output frequency sweeps past one harmonic of the instantaneously selected harmonic group and second detector means for generating counter signals when said output frequency sweeps past the intermediate point between adjacent harmonics of the instantaneously selected harmonic group.

6. In a frequency synthesizer having a phase locked loop for generating an output frequency including means for sweeping said output frequency during a search mode, a hormonic frequency generator for generating harmonic reference frequencies at a predetermined channel spacing and a mixer means for detecting the nulls obtained when said output frequency is mixed with said harmonic reference frequencies, said nulls being counted until a preselected number corresponding to a desired synthesizer output frequency is counted at which time the search mode is terminated and the phase locked loop locks at the desired synthesizer output frequency, an improvement comprising:
- null detector means for generating a first signal when said output frequency as swept passes one of said harmonic reference frequencies;
- intermediate detector means for generating a second signal when said output frequency as swept passes the approximate midpoint between two said harmonic reference frequencies;
- counter means for accumulating said first and second signals; and,
- gating means responsive to the instantaneous state of said counter means for directing said first and second signals to said counter means and for controlling the rate at which said output frequency is swept during said search mode.

7. The improvement of claim 6 wherein said gating means includes means responsive to the instantaneous state of said counter means for extinguishing said harmonic reference frequencies and for generating a different group of harmonic reference frequencies, said null detector means and said intermediate detector means being responsive to said different group when generated.

8. A frequency synthesizer comprising:
- means for generating a plurality of reference frequency signals at decade intervals;
- means responsive to control signals for selecting one of said plurality of reference frequency signals;
- a spectrum generator for generating the harmonics of the selected reference frequency signal;
- a voltage controlled oscillator responsive to an applied voltage signal for generating an output frequency;
- mixer means responsive to the harmonics of the selected reference frequency signal and said output signal for generating a first signal when said output signal sweeps through one of said harmonics and for generating a second signal when said output frequency sweeps through a point intermediate adjacent ones of said harmonics;

first detector means for generating counter signals in response to said first signals when the speed at which said output frequency is swept is within a predetermined rate;

second detector means for generating counter signals in response to said second signals;

counter means for accumulating said counter signals;

gate means responsive to the instantaneous state of said counter means for generating said control signals; and, means responsive to said control signals for controlling the rate of change of said voltage signal.

9. The frequency synthesizer of claim 8 wherein said first detector means comprises a plurality of null detectors, each associated with only one of said reference frequency signals and generating counter signals when said output frequency sweeps through the harmonics of its associated reference signal, and wherein said second detector means comprises a plurality of intermediate detectors, each associated with only one of said reference frequency signals and generating counter signals when said output frequency sweeps through a point intermediate adjacent ones of the harmonics of its associated reference frequency signal.

10. The frequency synthesizer of claim 9 wherein said counter means comprises a plurality of counters, each said counter associated with a different one of said reference frequency signals and with additionally a plurality of selectors, one associated with each said counter and for entering a binary number into the associated counter, the binary number so entered being related to a portion of a desired synthesizer output frequency.

11. The frequency synthesizer of claim 10 with additionally means for generating a start signal, said counter means being responsive to said start signal for acquiring a number related to a desired synthesizer output frequency and for driving said voltage signal to a base value whereby said output frequency is driven to a base frequency.

12. The frequency synthesizer of claim 11 wherein said means for generating a start signal in response to any one of a plurality of conditions indicative of said synthesizer output frequency not being at a desired value.

* * * * *